United States Patent [19]

Auvinen et al.

[11] Patent Number: 4,954,987
[45] Date of Patent: Sep. 4, 1990

[54] INTERLEAVED SENSING SYSTEM FOR FIFO AND BURST-MODE MEMORIES

[75] Inventors: Stuart T. Auvinen, Santa Cruz; Barry A. Hoberman, Mountain View, both of Calif.

[73] Assignee: Advanced Micro Devices, Inc., Sunnyvale, Calif.

[21] Appl. No.: 380,368

[22] Filed: Jul. 17, 1989

[51] Int. Cl.$^5$ ............................................. G11C 13/00
[52] U.S. Cl. ........................... 365/189.02; 365/189.05; 365/230.02; 365/230.08
[58] Field of Search ...................... 365/189.01, 189.02, 365/230.04, 189.05, 189.09, 230.02, 233, 230.08

[56] References Cited

U.S. PATENT DOCUMENTS 4,878,200 10/1989 Asghar ........................... 365/189.02

Primary Examiner—Terrell W. Fears
Attorney, Agent, or Firm—Davis Chin

[57] ABSTRACT

An interleaved sensing system for decreasing the read access time in a sequential memory includes a sequential memory array formed of a plurality of memory cells for storing data. The memory cells are arranged in a plurality of odd columns and a plurality of even columns. Sensing means are provided for interleaving the stored data in the memory cells in the odd columns with the stored data in the memory cells in the even columns. An output buffer is coupled to the sensing means for generating data output representing alternately the stored data in the odd and even columns during alternate read cycles.

20 Claims, 3 Drawing Sheets

INTERLEAVED SENSING SYSTEM FOR FIFO AND BURST-MODE MEMORIES

BACKGROUND OF THE INVENTION

This invention relates generally to first-in, first-out (FIFO) memory systems and more particularly, it relates to an interleaved sensing system used especially with FIFO and burst-mode memories for decreasing the read access time and thus its overall speed of operation.

As is generally known, a FIFO is essentially a data buffer in which data is shifted out in the same chronological order as it was shifted in with the shifting in and shifting out operations generally being able to function simultaneously and at the same or different speeds. Memory system designers have developed heretofore memory systems having FIFO memory units wherein data that is entered into the memory system will be sequentially passed therethrough. Typically, these prior art FIFO systems are implemented using a random-access-memory (RAM) and switching circuits controlled by a column decoder located near the ends of the bit lines. During a read cycle, one of the switching circuits is made conductive so as to precharge the data lines. Therefore, a great deal of time is required for setting up the data lines to a predetermined potential when the stray capacitance is large. Thus, this precharge time of the data lines restricts the speed of these prior art FIFO systems.

Referring to the set of waveforms in FIGS. 1(a)-1(e), there is shown a general read cycle timing of the prior art FIFO systems. As can be seen, the steps of (1) precharging of the data lines to be used, (2) activating of the column select transistors for coupling the bit lines with the data lines, and (3) transferring of the data to the output are all performed in one read cycle between the times t1 to t2. Consequently, a relatively large read cycle time is required.

It would therefore be desirable to provide an interleaved sensing system for use with FIFO and burst-mode memories for decreasing its read access time. This is achieved in the present invention by providing two paths from the bit lines in the FIFO RAM array so as to permit the read operation to take place over two cycles rather than a single cycle of the prior art. This can be best understood by reference to the set of waveforms in FIGS. 2(a)-2(f), which illustrates the general read cycle timing of the present invention. The data that is to appear on the output during the read cycle (between the times tA to tB) is begun to be read from the FIFO RAM array one cycle earlier. At the time t1, the data lines to be used are precharged. At the time t2, the column select signal is used to activate select transistors located between the bit lines and the data lines. As a result, the data on the bit lines will be transferred to the data lines during the next cycle. At the time t3, which is one full cycle later, a multiplexer is enabled by the read signal of FIG. 2(d) so as to select the appropriate sense amplifier. At the time t4, the output buffer is enabled so as to transfer the data from the sense amplifier to the output at the time t5.

SUMMARY OF THE INVENTION

Accordingly, it is a general object of the present invention to provide an interleaved sensing system for decreasing the read access time in a sequential memory.

It is an object of the present invention to provide an interleaved sensing system for use with FIFO and burst-mode memories so as to provide a short read access time.

It is another object of the present invention to provide an interleaved sensing system having two paths from bit lines in a FIFO RAM array so as to permit the read operation to take place over two cycles, thereby increasing the read frequency of the FIFO array.

In a preferred embodiment disclosed for purposes of illustrating one of the many forms which the invention may take in practice, there is provided an interleaved sensing system for decreasing the read access time in a sequential memory which includes a sequential memory array formed of a plurality of memory cells for storing data. The memory cells are arranged in a plurality of odd columns and a plurality of even columns. Sensing means are provided for interleaving the stored data in the memory cells in the odd columns with the stored data in the memory cells in the even columns. An output buffer is coupled to the sensing means for generating output data representing alternately the stored data in the odd and even columns during alternate read cycles.

In a second embodiment of the present invention, the interleaved sensing system is applied to a sequential memory array formed of a plurality of memory cells for storing data in which the memory cells are arranged in a plurality of blocks of memory cells.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
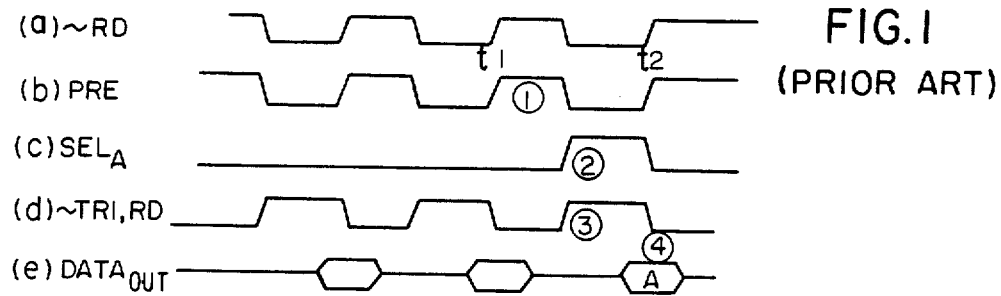
FIGS. 1(a)-1(e) show a set of waveforms useful for explaining the read cycle operation of the prior art FIFO memory systems.
Figure 2:
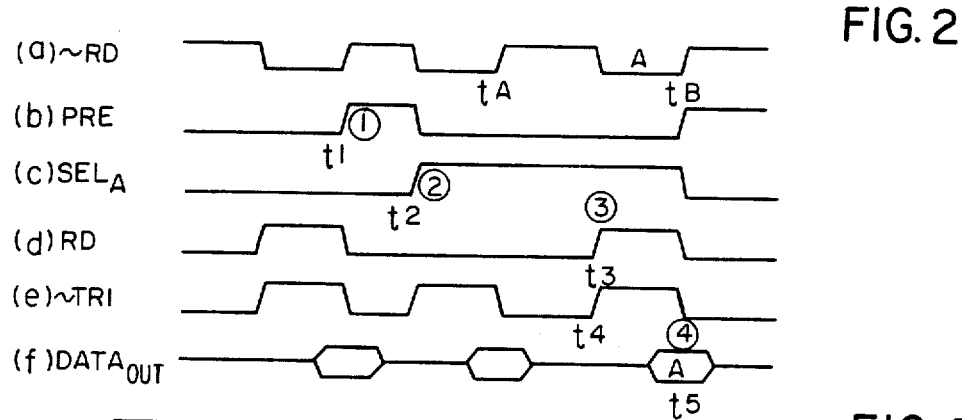
FIGS. 2(a)-2(f) show a set of waveforms useful for explaining the read cycle operation of the present invention.
Figure 3:
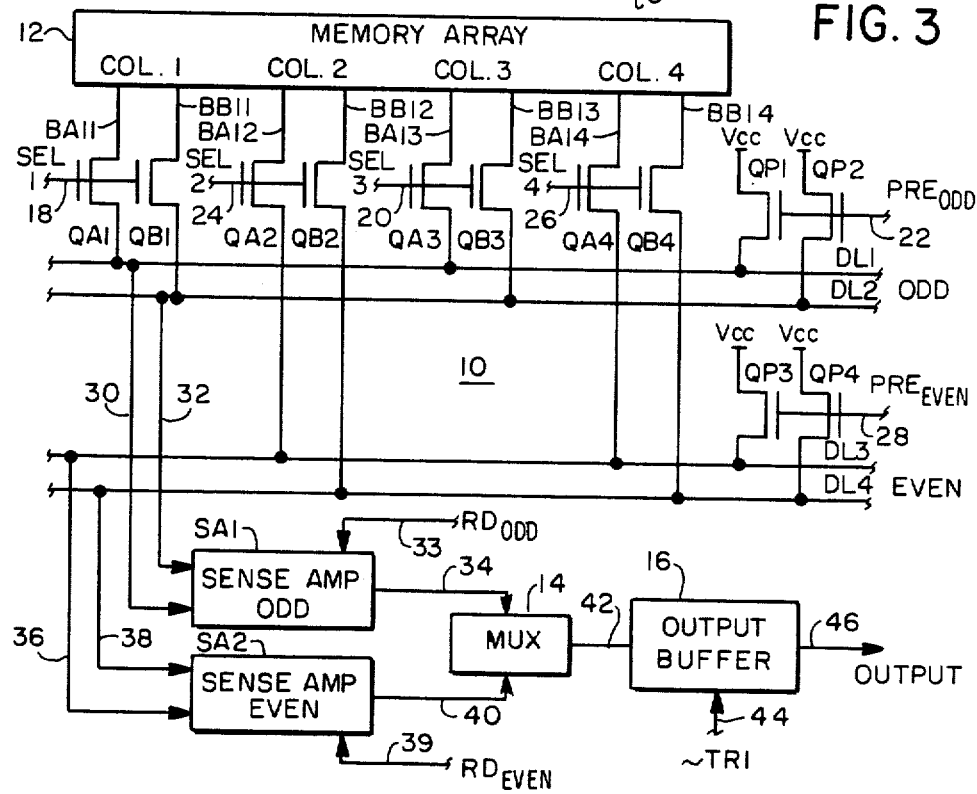
FIG. 3 is a schematic circuit diagram of an interleaved sensing system of the present invention which is applied to a FIFO memory system having a single RAM array.

Referring now to FIG. 3 of the drawings, there is shown a schematic circuit diagram of an interleaved sensing system 10 of the present invention which is applied to a sequential, such as a FIFO, memory system having a single RAM block 12. The RAM block 12 includes a matrix of memory cells (not shown) arrayed on a semiconductor chip. For example, the RAM block 12 may be implemented as a 1K×9 FIFO which allows for the storage of 1,024 nine bit words. The memory cells in the first column COL1 are laid between bit lines BA11 and BB11, and the memory cells in the second column COL2 are laid between bit lines BA12 and BB12. Similarly, the memory cells in the third column COL3 are disposed between bit lines BA13 and BB13, and the memory cells in the fourth column COL4 are disposed between bit lines BA14 and BB14, and so on.

The interleaved sensing system 10 is comprised of pass gates defined by pairs of N-channel MOS column select transistors QA1, QB1, . . . QA4, QB4 associated with each of the respective columns COL1 . . . COL4; a pair of N-channel MOS odd precharging transistors QP1 and QP2; a pair of N-channel MOS even precharging transistors QP3 and QP4; an odd sense amplifier SA1; an even sense amplifier SA2; a multiplexer 14; and an output buffer 16. There is also provided a first set of odd data lines DL1 and DL2 associated with the odd columns, i.e., COL1 and COL3. Further, there is provided a second set of even data lines DL3 and DL4 associated with the even columns, i.e., COL2 and COL4.

The conduction path electrodes of the column select transistor QA1 are coupled between the bit lines BA11 and the data line DL1 of the first set, and the conduction path electrodes of the column select transistor QB1 are coupled between the bit line BB11 and the data line DL2 of the first set. The gate electrodes of the transistors QA1 and QB1 are connected to receive column select signal SEL1 via line 18. Further, the conduction path electrodes of the column select transistor QA3 are coupled between the bit line BA13 and the data line DL1, and the conduction path electrodes of the column select transistor QB3 are coupled between the bit line BB13 and the data line DL2. The gate electrodes of the transistors QA3 and QB3 are connected to receive a column select signal SEL3 via line 20. The conduction path electrodes of the odd precharging transistor QP1 are coupled between a supply voltage or potential VCC and the data line DL1 of the first set. The conduction path of the odd precharging transistor QP2 are coupled between the supply potential VCC and the data line DL2 of the first set. The gate electrodes of the transistors QP1 and QP2 are connected to receive an odd precharging signal PRE$_{ODD}$.

Similarly, the conduction path electrodes of the column select transistor QA2 are coupled between the bit line BA12 and the data line DL3 of the second set, and the conduction path electrodes of the column select transistor QB3 are coupled between the bit lines BB13 and the data line DL4 of the second set. The gate electrodes of the transistors QA2 and QB2 are connected to receive a column select signal SEL2 via line 24. Further, the conduction path electrodes of the column select transistor QA4 are coupled between the bit line BA14 and the data line DL3, and the conduction path electrodes of the column select transistor QB4 are coupled between the bit line BB14 and the data line DL4. The gate electrodes of the transistors QA4 and QB4 are connected to receive a column select signal SEL4 via line 26. The conduction path electrodes of the even precharging transistor QP3 are coupled between the supply potential VCC and the data line DL3 of the second set. The conduction path electrodes of the even precharging transistor QP4 are coupled between the supply potential VCC and the data line DL4 of the second set. The gate electrodes of the transistors QP3 and QP4 are connected to receive an even precharging signal PRE$_{EVEN}$.

The odd sense amplifier SA1 senses a potential difference via lines 30, 32 between the odd data lines DL1 and DL2 which represents the potential difference on one of the pairs of bit lines associated with the odd columns. The particular odd column being sensed is dependent upon which of the respective column select transistors are turned on. The odd sense amplifier SA1 is controlled by an odd read signal RD$_{ODD}$ which causes the potential difference to appear on output line 34. The even sense amplifier SA2 senses a potential difference via lines 36, 38 between the even data lines DL3 and DL4 which represents the potential difference on one of the pairs of bit lines associated with the even columns. The particular even column being sensed is dependent upon which of the respective column select transistors are being turned on. The sense amplifier SA2 is controlled by an even read signal RD$_{EVEN}$ which causes the potential difference to appear on output line 40.

The multiplexer 14 is used to pass alternately the odd potential difference on the line 34 from the odd sense amplifier SA1 and the even potential difference on the line 40 from the even sense amplifier SA2 to the output buffer 16 via line 42. The output buffer 16 is controlled by a transfer read signal $\overline{TRI}$ on line 44 for sending the output of the multiplexer 14 to an output data line 46. The output data line 46 connected to the output of the buffer 16 provides a data out signal DATA$_{OUT}$.

Figure 4:
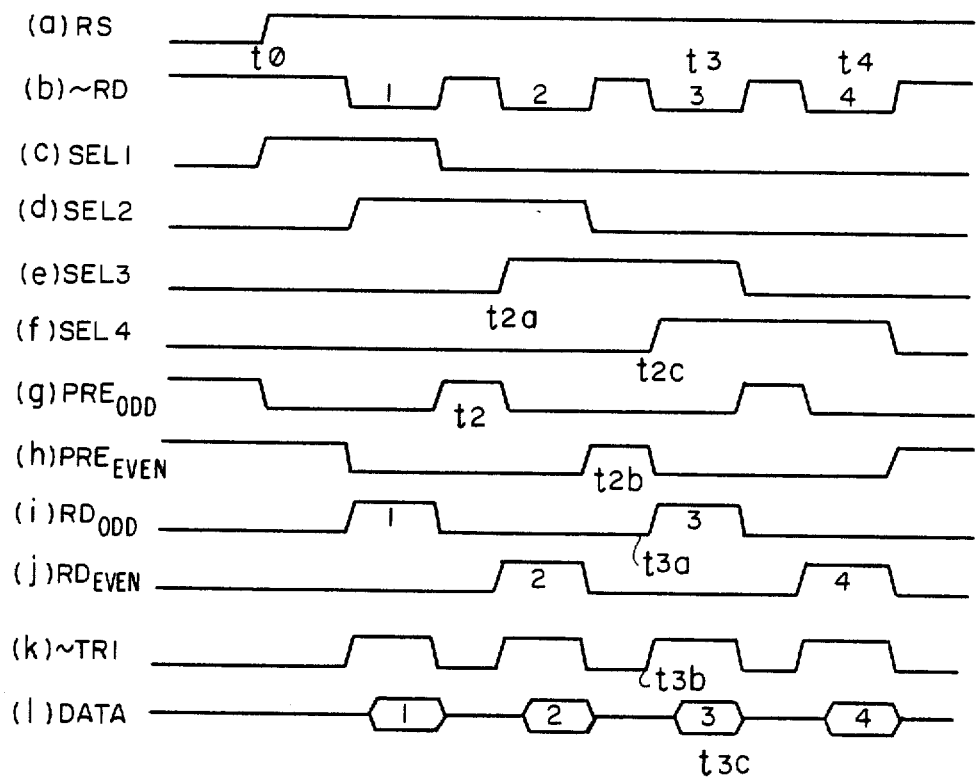
FIGS. 4(a)-4(l) are timing diagrams useful for explaining the read cycle operation of the memory system of FIG. 3.

The operation of the interleaved sensing system 10 of FIG. 3 will now be explained with reference to the set of waveforms shown in FIGS. 4(a)–4(l). When a row select signal RS, as shown in FIG. 4(a), is received by a timing controller (not shown) at time t0, there is 7255 generated the read pulses $\overline{RD}$ illustrated in FIG. 4(b). It will be assumed that it is desired to read the stored data in the third column between the bit lines BA13 and BB13 on the third read pulse at time t3.

As can be seen, the odd precharging transistors QP1 and QP2 are turned on by the odd precharging signal of FIG. 4(g) at the time t2, which is one full read pulse cycle prior to the third read pulse. As a result, there is provided an extra cycle for charging/discharging the large odd data lines DL1 and DL3. At the time t2a, the column select transistors QA3, QB3 are turned on by the column select signal SEL3 illustrated in FIG. 4(e). This causes the potential difference on the data lines DL1 and DL2 to vary with those on the bit lines BA13 and BB13. At the time t3a, being one full read cycle later, the odd read signal RD$_{ODD}$ shown in FIG. 4(i) causes the output of the odd sense amplifier SA1 to be sent to the output buffer 16 via the multiplexer 14. When the transfer read signal $\overline{TRI}$ shown in FIG. 4(k) is activated at the time t3b, the data signal DATA$_{OUT}$ is outputted to the output line 46 at the time t3c.

In a similar manner, the stored data in the fourth column between the bit lines BA14 and BB14 is read on the fourth read pulse at the time t4 in FIG. 4(b). However, it will again be noted that the even precharging transistors QP3 and QP4 are turned on by the even precharging signal of FIG. 4(h) at the time t2b, which is one full read pulse cycle prior to the fourth read pulse. Also, at the time t2c, the column select transistors QA4, QB4 are turned on by the column select signal SEL4, illustrated in FIG. 4(f).

As should be appreciated by those skilled in the art, the stored data in the odd and even columns are sensed or read alternately by two paths from the bit lines in the RAM array block 12 to the output line 46. In other words, each path is used on alternate cycles so that the read mode of operation from the bit lines to the output line occurs over two cycles, thereby shortening the read access time. Consequently, the read frequency of the FIFO memory system has been effectively doubled. It should be clearly understood that larger speed gains may be achieved by utilizing additional paths. For example, if there are four paths used the read frequency would be essentially quadrupled over the prior art FIFO memory system. However, there is a trade-off of increased cost due to the need of additional circuitry and more chip area.

Figure 5:
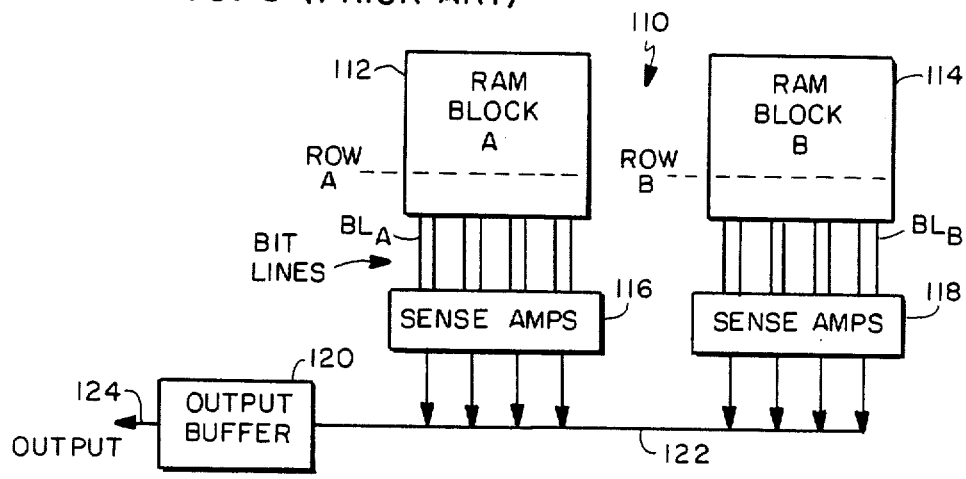
FIG. 5 is a block diagram of a prior art sequential memory system using split or multiple RAM arrays.

In FIFOs and other memories where data are read from sequential addresses, memory system designers are generally aware that speed can be increased by taking advantage of the fact that the locations of the next words to be read are known. In U.S. Pat. No. 4,642,797 to Barry A. Hoberman owned by the same assignee as the present invention, there is described a sequential memory which allows for a greater maximum shift rate by partitioning the memory into several separate RAM blocks. This '797 patent is hereby incorporated by reference. A simplified block diagram of such a prior art memory system using two RAM blocks is illustrated in FIG. 5. As can be seen, the memory system 110 includes a first array 112 formed by the RAM block A and a second array 114 formed by the RAM block B. Sense amplifiers 116 are coupled to bit lines BL$_A$ associated with the first array 112. Sense amplifier 118 are coupled to bit lines BL$_B$ associated with the second array 114. An output buffer 120 has its input coupled to the outputs of the sense amplifiers 116 and 118 via data line 122. Data is outputted from the buffer 120 via line 124.

Figure 6:
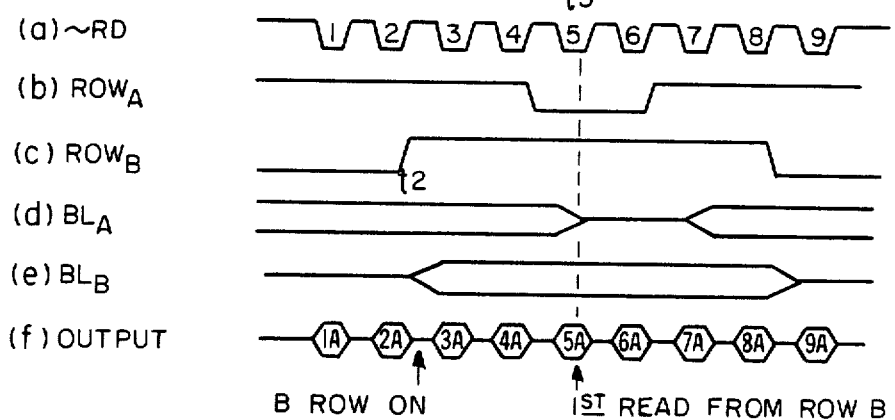
FIG. 6(a)-6(f) are timing diagrams useful for explaining the read cycle operation of the memory system of FIG. 5.

In FIGS. 6(a)-6(f), there is illustrated a set of waveforms useful in understanding the operation of FIG. 5. Assume that the stored data from the RAM block B is to be read by the fifth read pulse cycle at the time t5 shown in FIG. 6(a). The row select signal ROW$_B$ of FIG. 6(c) is turned on at time t2 several read pulse cycles earlier. This allows the bit line BL$_B$ of FIG. 6(e) to develop a large potential difference before the sense amplifiers 118 are turned on at the beginning of the fifth read cycle at the time t5. Thus, this multiple-block architecture has increased the read access frequency over the single block RAM. However, it still suffers from the disadvantage of the delay time in transferring the stored data from the sense amplifiers 116 and 118 to the output line 124.

Figure 7:
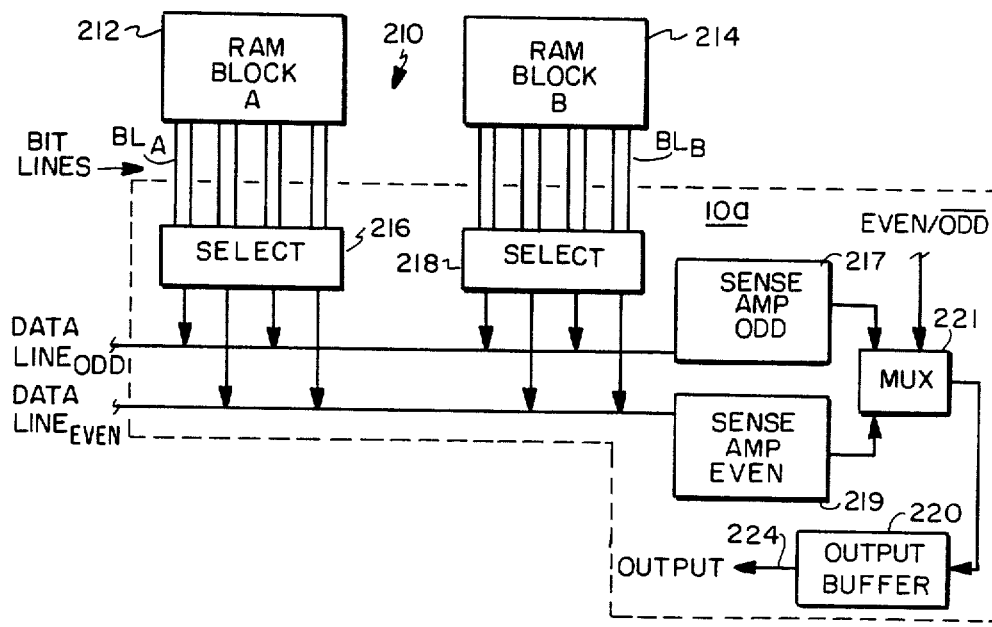
FIG. 7 is a block diagram of another embodiment of the interleaved sensing system of the present invention which is applied to a sequential memory system using multiple RAM arrays.

In a second embodiment of the present invention, there is shown in FIG. 7 the interleaved sensing system 10a of the present invention which is applied to a sequential memory system 210 using multiple RAM arrays 212, 214. The RAM block 212 includes a matrix of memory cells (not shown) arrayed on a semiconductor chip. Similarly, the RAM block 214 includes a matrix of memory cells (not shown) arrayed on the same semiconductor chip. The interleaved sensing system 10a is shown in block diagram form and is implemented with the same components as illustrated in FIG. 3. A plurality of bit line pairs BL$_A$ are used to couple the RAM block A (212) to the interleaved sensing system 10a. Also, a plurality of bit line pairs BL$_B$ are used to couple the RAM block B (214) to the interleaved sensing system 10a.

Figure 8:
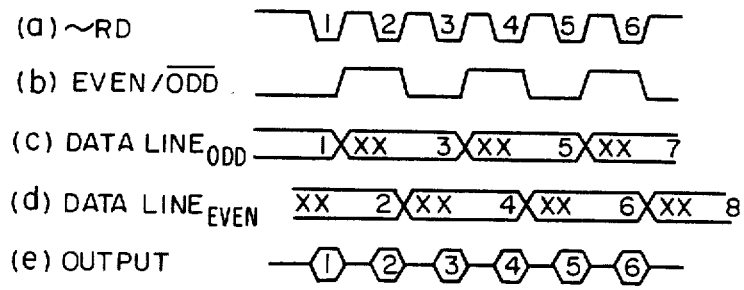
FIGS. 8(a)-8(e) are timing diagrams useful for explaining the read operation of the memory system of FIG. 7.

In FIG. 8(a)-8(e), there is depicted a set of waveforms useful in understanding the operation of FIG. 7. The read pulse cycles are shown in FIG. 8(a). The stored data in the odd and even columns are transferred to the data lines DATA LINE$_{ODD}$ and DATA LINE$_{EVEN}$, as shown in FIGS. 8(c) and 8(d) when the appropriate pass gates in the select blocks 216, 218 are activated. The stored data on the data lines are then alternately read from the odd and even sense amplifiers 217, 219 in response to a control signal $\overline{EVEN/ODD}$, as illustrated in FIG. 8(b) and applied to a multiplexer 221. The data output on line 224 from the buffer 220 is shown in FIG. 8(e).

From the foregoing detailed description, it can thus be seen that the present invention provides an interleaved sensing system for decreasing the read access time in a sequential memory. A sequential memory array is formed of a plurality of memory cells for storing data. The memory cells are arranged in a plurality of odd columns and a plurality of even columns. Sensing means are provided for interleaving the stored data in the memory cells in the odd columns with the stored data in the memory cells in the even columns. An output buffer is coupled to the sensing means for generating output data representing alternately the stored data in the odd and even columns during alternate read cycles.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best mode contemplated for carrying out the invention, but that the invention will include all embodiments falling within the scope of the appended claims.

What is claimed is:

1. An interleaved sensing system for decreasing the read access time in a sequential memory, comprising in combination:

a sequential memory array formed of a plurality of memory cells for storing data, said memory cells being arranged in a plurality of odd columns and a plurality of even columns;

odd bit line means coupled to said plurality of odd columns;

even bit line means coupled to said plurality of even columns;

odd selecting means responsive to odd column select signals and coupled to said odd bit line means for accessing and transferring the stored data in selected ones of said memory cells in said odd columns to a pair of odd data lines;

even selecting means responsive to even column select signals and coupled to said even bit line means for accessing and transferring the stored data in selected ones of said memory cells in said even columns to a pair of odd data lines;

odd precharging means responsive to an odd precharging signal for precharging said pair of odd data lines prior to the transferring of the stored data in said odd columns to said pair of odd data lines;

even precharging means responsive to an even precharging signal for precharging said pair of even data lines prior to the transferring of the stored data in said even columns to said pair of even data lines;

odd sensing means coupled to said pair of odd data lines for sensing said stored data in said odd columns and for generating an odd output signal in response to an odd read signal;

even sensing means coupled to said pair of even data lines for sensing said stored data in said even columns and for generating an even output signal in response to an even read signal;

multiplexing means coupled to said odd and even sensing means for alternately supplying said odd output signal and said even output signal in a predetermined timing relationship; and output means coupled to said multiplexing means for generating output data representing alternately said stored data in said odd and even columns in response to a read transfer signal.

2. An interleaved sensing system as claimed in claim 1, wherein said odd selecting means includes a plurality of first paired pass gate means, each of said first paired pass gate means being associated with a corresponding one of said plurality of odd columns.

3. An interleaved sensing system as claimed in claim 2, wherein each of said first paired pass gate means is formed of two N-channel MOS column select transistors.

4. An interleaved sensing system as claimed in claim 3, wherein said even selecting means includes a plurality of second paired pass gate means, each of said second paired pass gate means being associated with a corresponding one of said plurality of even columns.

5. An interleaved sensing system as claimed in claim 4, wherein each of said second paired pass gate means is formed of two N-channel MOS column select transistors.

6. An interleaved sensing system as claimed in claim 5, wherein said odd precharging means is comprised of a pair of N-channel MOS odd precharging transistors.

7. An interleaved sensing system as claimed in claim 6, wherein said even precharging means is comprised of a pair of N-channel MOS even precharging transistors.

8. An interleaved sensing system as claimed in claim 7, wherein said odd sensing means comprises an odd sense amplifier.

9. An interleaved sensing system as claimed in claim 8, wherein said even sensing means comprises an even sense amplifier.

10. An interleaved sensing system for decreasing the read access time in a sequential memory, comprising in combination:

a sequential memory array formed of a plurality of memory cells for storing data, said plurality of memory cells being arranged in a plurality of blocks of memory cells, said memory cells in each of said plurality of blocks being arranged in a plurality of odd columns and a plurality of even columns;

odd bit line means coupled to said plurality of odd columns in each of said plurality of blocks;

even bit line means coupled to said plurality of even columns in each of said plurality of blocks;

odd selecting means responsive to odd column select signals and coupled to said odd bit line means for accessing and transferring the stored data in selected ones of said memory cells in said odd columns to a pair of odd data lines;

even selecting means responsive to even column select signals and coupled to said even bit line means for accessing and transferring the stored data in selected ones of said memory cells in said even columns to a pair of odd data lines;

odd precharging means responsive to an odd precharging signal for precharging said pair of odd data lines prior to the transferring of the stored data in said odd columns to said pair of odd data lines;

even precharging means responsive to an even precharging signal for precharging said pair of even data lines prior to the transferring of the stored data in said even columns to said pair of even data lines;

odd sensing means coupled to said pair of odd data lines for sensing said stored data in said odd columns and for generating an odd output signal in response to an odd read signal;

even sensing means coupled to said pair of even data lines for sensing said stored data in said even columns and for generating an even output signal in response to an even read signal;

multiplexing means coupled to said odd and even sensing means for alternately supplying said odd output signal and said even output signal in a predetermined timing relationship; and output means coupled to said multiplexing means for generating output data representing alternately said stored data in said odd and even columns in response to a read transfer signal.

11. An interleaved sensing system as claimed in claim 10, wherein said odd selecting means includes a plurality of first paired pass gate means, each of said first paired pass gate means being associated with a corresponding one of said plurality of odd columns.

12. An interleaved sensing system as claimed in claim 11, wherein each of said first paired pass gate means is formed of two N-channel MOS column select transistors.

13. An interleaved sensing system as claimed in claim 12, wherein said even selecting means includes a plurality of second paired pass gate means, each of said second paired pass gate means being associated with a corresponding one of said plurality of even columns.

14. An interleaved sensing system as claimed in claim 13, wherein each of said second paired pass gate means is formed of two N-channel MOS column select transistors.

15. An interleaved sensing system as claimed in claim 14, wherein said odd precharging means is comprised of a pair of N-channel MOS odd precharging transistors.

16. An interleaved sensing system as claimed in claim 15, wherein said even precharging means is comprised of a pair of N-channel MOS even precharging transistors.

17. An interleaved sensing system as claimed in claim 16, wherein said odd sensing means comprises an odd sense amplifier.

18. An interleaved sensing system as claimed in claim 17, wherein said even sensing means comprises an even sense amplifier.

19. An interleaved sensing system for decreasing the read access time in a sequential memory, comprising in combination:
   a sequential memory array formed of a plurality of memory cells for storing data, said memory cells being arranged in a plurality of odd columns and a plurality of even columns;
   sensing means for interleaving said stored data in said memory cells in said odd columns with said stored data in said memory cells in said even columns; and
   output means coupled to said sensing means for generating output data representing alternately said stored data in said odd and even columns during alternate read cycles.

20. An interleaved sensing system as claimed in claim 19, further comprising selecting means and precharging means for transferring the stored data from corresponding bit lines to said sensing means at least one read cycle earlier than the present read cycle being accessed.

* * * * *